United States Patent [19]

Jeong et al.

[11] Patent Number: 6,107,138

[45] Date of Patent: *Aug. 22, 2000

[54] METHOD FOR FABRICATING A SEMICONDUCTOR DEVICE HAVING A TAPERED CONTACT HOLE

[75] Inventors: Ei Sam Jeong; Sang Wook Kim; Byung Suk Lee; Yong Hyeock Yoon, all of Kyoungkido, Rep. of Korea

[73] Assignee: Hyundai Electronics Industries Co., Ltd., Ichon-Shi, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/744,805

[22] Filed: Nov. 6, 1996

[30] Foreign Application Priority Data

Nov. 6, 1995 [KR] Rep. of Korea .................. 95-39934

[51] Int. Cl.[7] .............................................. H01L 21/8242
[52] U.S. Cl. ......................... 438/254; 438/255; 438/257; 438/701; 438/723
[58] Field of Search ................................. 438/238, 253, 438/254, 255, 256, 396, 701, 723

[56] References Cited

U.S. PATENT DOCUMENTS

| | | | |
|---|---|---|---|
| 4,978,634 | 12/1990 | Shen et al. | 437/52 |
| 5,206,187 | 4/1993 | Doan et al. | 437/192 |
| 5,292,684 | 3/1994 | Chung et al. | 438/238 |
| 5,312,769 | 5/1994 | Matsuo et al. | 437/52 |
| 5,403,767 | 4/1995 | Kim | 437/52 |

FOREIGN PATENT DOCUMENTS

| | | |
|---|---|---|
| 64-80076 | 3/1989 | Japan . |
| 3-155664 | 7/1991 | Japan . |
| 6-120447 | 4/1994 | Japan . |
| 9-55477 | 2/1997 | Japan . |
| 95-21063 | 7/1995 | Rep. of Korea . |

*Primary Examiner*—Caridad Everhart
*Assistant Examiner*—Granvill Lee
*Attorney, Agent, or Firm*—Jacobson, Price, Holman & Stern, PLLC

[57] ABSTRACT

A semiconductor device includes: a field oxide layer formed on a semiconductor substrate; a transistor having an active region formed on a semiconductor substrate; an interlayer insulating layer formed on the transistor and the field oxide; and a tapered contact hole exposing the active region adjacent to the field oxide layer, wherein an upper portion of the tapered contact hole is wider than a lower portion thereof so that the field oxide is not etched during the contact hole etching process. A method for fabricating a semiconductor device includes the steps for: forming a field oxide layer on a semiconductor substrate; forming a transistor having an active region on a semiconductor substrate; forming an interlayer insulating layer on the resulting structure; and forming a tapered contact hole exposing the active region adjacent to the field oxide layer, wherein an upper portion of the tapered contact hole is wider than a lower portion thereof so that the field oxide is not etched during the contact hole etching process.

3 Claims, 2 Drawing Sheets

METHOD FOR FABRICATING A SEMICONDUCTOR DEVICE HAVING A TAPERED CONTACT HOLE

FIELD OF THE INVENTION

This invention relates to a semiconductor device and a method for fabricating the same, and more particularly to a semiconductor device having an improved storage capacitor contact for improved refresh characteristics and a method for fabricating the same.

BACKGROUND OF THE INVENTION

Generally, a dynamic random access memory("DRAM") device requires a refresh operation to periodically compensate for the charges discharged from a storage capacitor due to the leakage at predetermined time intervals. The time interval required for this refresh operation is called a "refresh time". In the DRAM technology, the refresh time is one of the measures of the reliability of a semiconductor device and a commercially available 16M DRAM device requires a refresh time of at least 300 ms.

The refresh time of a semiconductor device is closely related to a storage capacitor contact and a method for fabricating the same.

The conventional method for fabricating the storage capacitor contact of a semiconductor device will be described hereinafter with reference to FIGS. 1A to 1B, which are simplified cross sectional views illustrating the process flow of the method for fabricating the conventional storage capacitor contact.

First, referring to FIG. 1A, after forming a P-well 8 in the silicon substrate 1, a field oxide layer 2, and a transistor having a gate electrode 4, an oxide spacer 3 and a active(i.e. source/drain) region 7 are formed on the substrate 1. Then, an oxide layer 5 is formed on the resulting structure for the interlayer insulation and the planarization. A photo resist pattern 6 is then formed on the oxide layer 5. The photo resist 6 is used as an etch mask to form a storage capacitor contact.

Next, referring to FIG. 1B, a contact hole is formed to expose the active region 7 by etching the oxide layer 5 with the photo resist 6, the etch mask. Then, after removing the photo resist 6, a polysilicon layer 9, which is used as a storage node of a storage capacitor, is formed on the resulting structure.

However, in recent years, the elements of a semiconductor device are integrated with higher density in a relatively limited chip area, so the contact area for the storage capacitor has been decreasing. As a result, in the conventional semiconductor device, the field oxide layer 2 is etched during the etching process of the oxide layer 5 to form the storage capacitor contact(refer to "a" in FIG. 1B.), whereby the polysilicon layer 9 is connected directly to the P-well 8. This direct connection of the storage node to the silicon substrate results in the charge leakage through the current path in this area and the refresh time being decreased.

SUMMARY OF THE INVENTION

Therefore, the present invention has been made in view of the above mentioned problem. The present invention provides a semiconductor device with improved storage capacitor contact and a method for fabricating the same, in order to improve the reliability of the semiconductor device by increasing the refresh time with a storage capacitor contact having an improved profile.

In accordance with the present invention, there is disclosed a semiconductor device including: a field oxide layer formed on a semiconductor substrate; a transistor having a active region formed on a semiconductor substrate; an interlayer insulating layer formed on the transistor and the field oxide; and a tapered contact hole exposing the active region adjacent to the field oxide layer, wherein an upper portion of the tapered contact hole is wider than a lower portion thereof so that the field oxide is not etched during the contact hole etching process.

In accordance with the present invention, there is also disclosed a method for fabricating a semiconductor device including the steps for: forming a field oxide layer on a semiconductor substrate; forming a transistor having a active region on a semiconductor substrate; forming an interlayer insulating layer on the resulting structure; and forming a tapered contact hole exposing the active region adjacent to the field oxide layer, wherein an upper portion of the tapered contact hole is wider than a lower portion thereof so that the field oxide is not etched during the contact etching process.

BRIEF DESCRIPTION OF THE DRAWINGS

A further understanding of the nature and advantage of the present invention will become apparent by reference to the remaining portions of the specification and drawings.

DESCRIPTION OF THE PREFERRED EMBODIMENT

A detailed description of embodiments according to the present invention will be given below with reference to FIG. 2 and FIG. 3.

Figure 1A:
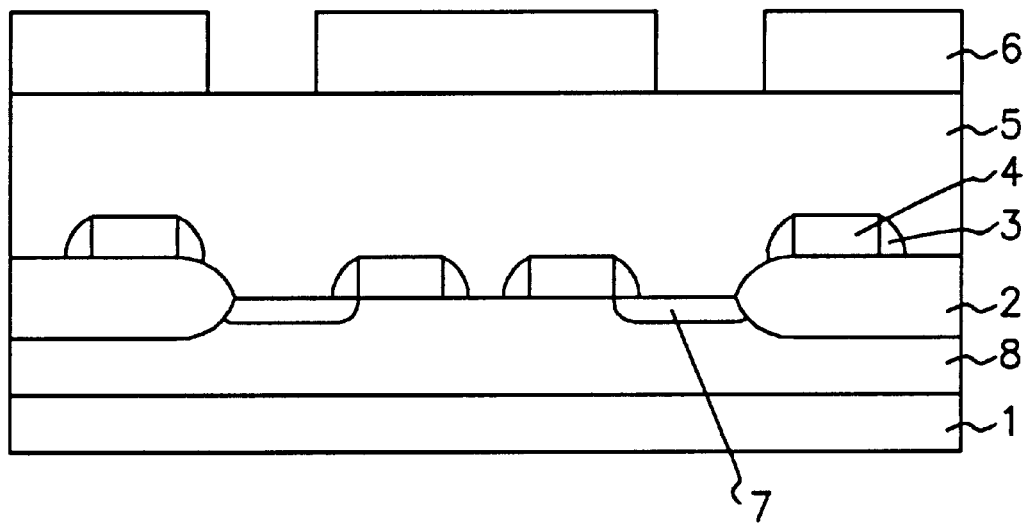
FIGS. 1A. to 1B are simplified cross sectional views which illustrate the process flow of the method for fabricating the conventional storage capacitor contact.
Figure 1B:
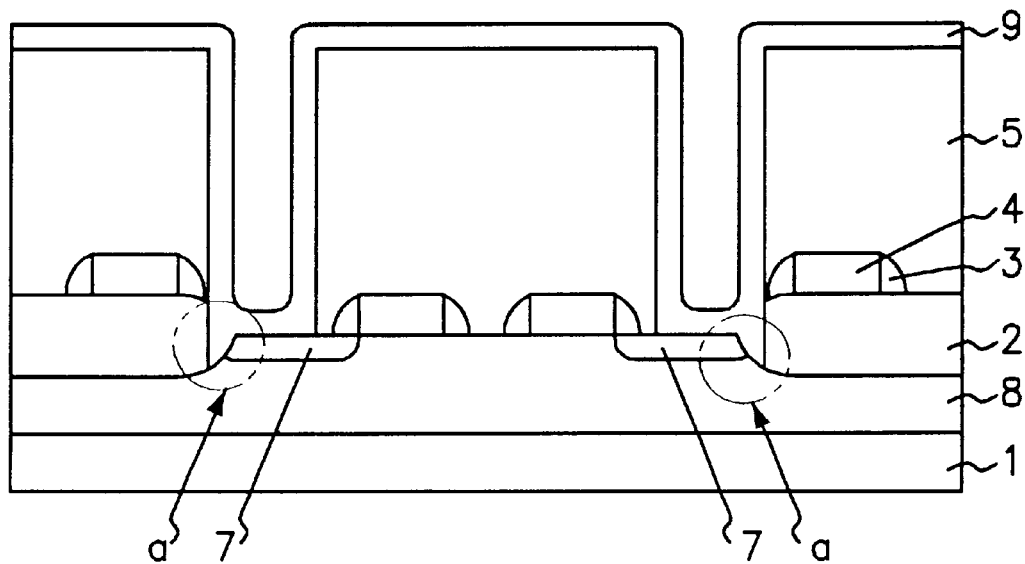
Figure 2:
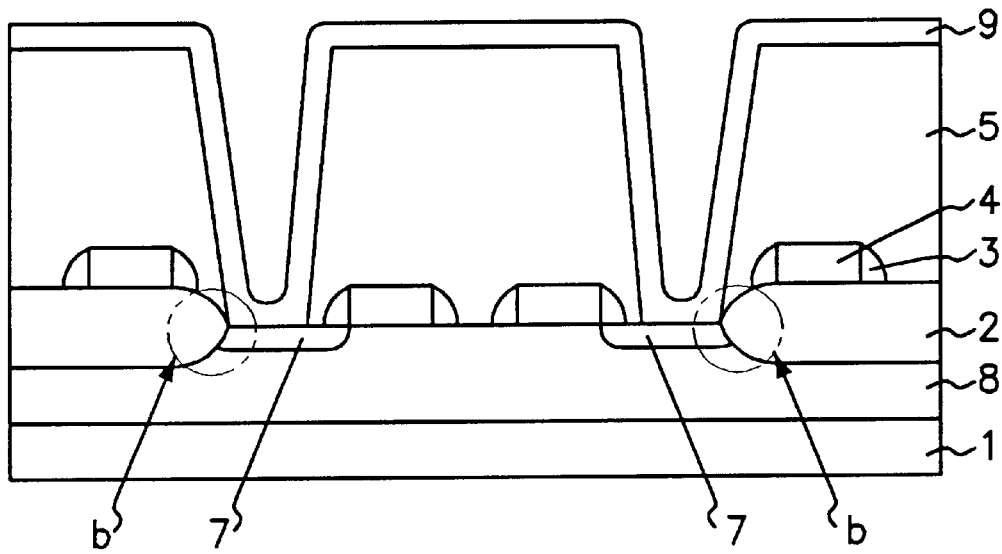
FIG. 2 is a simplified cross sectional view which illustrates one embodiment of a storage capacitor contact of a semiconductor device according to the present invention.

First, referring to FIG. 2, in accordance with one embodiment of the present invention, after forming a field oxide layer 2 and a transistor having a active region 7 on a silicon substrate, an interlayer insulating layer, for example an oxide layer 5, is formed on the resulting structure. Then, a contact hole of a storge capacitor, exposing the active region adjacent to the field oxide layer, is formed by etching the oxide layer 5. Furthermore, an upper portion of the contact hole is wider than a lower portion thereof so that the field oxide is not etched during the contact hole etching process, it results that the contact hole does not intrude upon the field oxide (refer to "b" in FIG. 2). The profile of the contact hole is taper to the active region. Then, a polysilicon layer 9, a storage node of the storage capacitor, is formed on the resulting structure.

The contact hole of smaller size at the active region of the present invention can be achieved by various methods, for example applying a taper etching to the oxide layer 5 with a predetermined patterned photo resist 6. This taper etching results in an inclined profile of the contact hole of the storage capacitor, and the above mentioned contact hole is formed.

The process condition for the above mentioned taper etching by CENTURA 5300 equipment is as follows; the source power is in the range of 1800 to 2700 Watt, the bias power is in the range of 600 to 1800 Watt, the flow rate of $C_3F_8$ gas is in the range of 0 to 50 sccm, the flow rate of CO gas is in the range of 30 to 100 sccm, the roof temperature is in the range of 200 to 280° C., the wall temperature is in the range of 200 to 240° C., the chuck temperature is in the range of −20 to 0° C. and the throttle valve open rate is in the range of 50 to 100%, and the gas ratio of $C_3F_8$:CO is in the range of 1:1 to 1:5.

Figure 3:
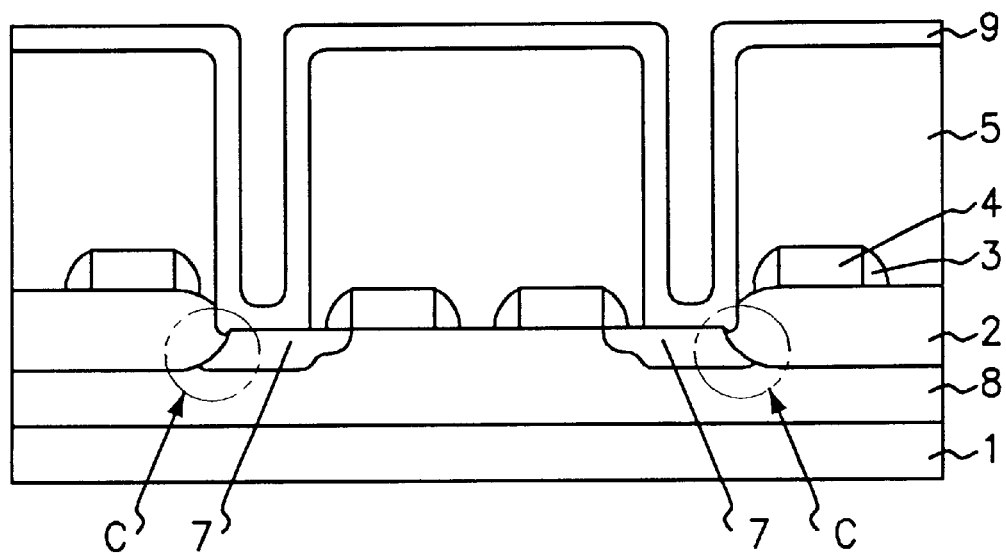
FIG. 3 a simplified cross sectional view which illustrates another embodiment of a storage capacitor contact of a semiconductor device according to the present invention.

Now, referring to FIG. 3, in accordance with another embodiment of the present invention, the contact hole of the storage capacitor has a round profile in the neighborhood of the active region(refer to "c" in FIG. 3), whereby the field oxide 2 is not entirely etched and the contact hole does not reach to the substrate 1. The process condition for the etching according to this embodiment by TEL 8500PATC equipment is as follows; the pressure is in the range of 200 to 400 mTorr, the power is in the range of 1000 to 1500 Watt, the flow rate of $CHF_3$ gas is in the range of 20 to 50 sccm, the flow rate of $CF_4$ gas is in the range of 10 to 50 sccm, the flow rate of Ar gas is in the range of 400 to 800 sccm and the pressure of He gas is 10 Torr.

As described above, according to the present invention, the field oxide layer 2 is not etched while the contact hole of the storage capacitor is etched, so that the storage node of the storage capacitor is not connected directly to the substrate 1 or P-well area 8. Therefore, the leakage of the charges stored in the storage capacitor is noticeably decreased, and as a result, the refresh time is increased.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a semiconductor device comprising the steps of:
   (a) forming a field oxide layer on a semiconductor substrate;
   (b) forming a transistor having an active region on said semiconductor substrate, thereby forming a resulting structure;
   (c) planarizing the resulting structure by forming an interlayer insulating layer; and
   (d) taper etching the interlayer insulating layer to form a tapered contact hole exposing said active region adjacent to said field oxide layer, wherein an upper portion of said tapered contact hole is wider than a lower portion thereof so that said field oxide is not etched during said taper etching process.

2. The method as claimed in claim 1, wherein $C_3F_8$ gas and CO gas are used in said step of the taper etching, the gas ratio of $C_3F_8$:CO being in the range of 1:1 to 1:5.

3. The method as claimed in claim 1, wherein said taper etching is performed by an etching equipment under operating conditions that a source power is in a range of 1800 to 2700 Watt, a bias power is in a range of 600 to 1800 Watt, a flow rate of $C_3F_8$ gas is in a range of 0 to 50 sccm, a flow rate of CO gas is in a range of 30 to 100 sccm, a roof temperature is in a range of 200 to 280° C., a wall temperature is in a range of 200 to 240° C., a chuck temperature is in a range of −20 to 0° C. and a throttle valve open rate is in a range of 50 to 100%.

* * * * *